United States Patent
Hsieh et al.

(10) Patent No.: US 7,161,301 B2
(45) Date of Patent: Jan. 9, 2007

(54) NITRIDE LIGHT-EMITTING DEVICE HAVING AN ADHESIVE REFLECTING LAYER

(75) Inventors: Min-Hsun Hsieh, Hsin-Chu (TW); Wen-Huang Liu, Hsin-Chu (TW); Ming-Jiunn Jou, Hsin-Chu (TW)

(73) Assignee: Epistar Corporation, Hsinchu (TW)

( * ) Notice: Subject to any disclaimer, the term of this patent is extended or adjusted under 35 U.S.C. 154(b) by 196 days.

(21) Appl. No.: 10/605,833

(22) Filed: Oct. 29, 2003

(65) Prior Publication Data
US 2004/0149996 A1 Aug. 5, 2004

(30) Foreign Application Priority Data
Jan. 30, 2003 (TW) ................ 92102926 A

(51) Int. Cl.
*H05B 33/00* (2006.01)
*H01L 27/15* (2006.01)
*H01L 27/00* (2006.01)

(52) U.S. Cl. .......... 313/598; 313/499; 257/88; 257/103; 257/79; 257/E33.025; 257/E33.028; 257/E33.033

(58) Field of Classification Search ........ 313/498, 313/503, 506–509; 257/88
See application file for complete search history.

(56) References Cited

U.S. PATENT DOCUMENTS

| | | | |
|---|---|---|---|
| 5,670,798 A * | 9/1997 | Schetzina | 257/96 |
| 6,100,545 A * | 8/2000 | Chiyo et al. | 257/98 |
| 6,768,855 B1 * | 7/2004 | Bakke et al. | 385/129 |
| 2001/0028062 A1 * | 10/2001 | Uemura et al. | 257/79 |
| 2002/0179914 A1 * | 12/2002 | Sheu | 257/90 |
| 2003/0062519 A1 * | 4/2003 | Yamazaki et al. | 257/40 |
| 2003/0129447 A1 * | 7/2003 | Madathil et al. | 428/690 |

FOREIGN PATENT DOCUMENTS

| | | | |
|---|---|---|---|
| JP | 06-302857 | * | 10/1994 |
| JP | 09-275164 | * | 10/1997 |
| JP | 10-270754 | * | 10/1998 |
| JP | 2002-170985 | * | 6/2002 |
| JP | 2002-246640 | * | 8/2002 |

* cited by examiner

*Primary Examiner*—Mariceli Santiago
*Assistant Examiner*—Elizabeth Rielley
(74) *Attorney, Agent, or Firm*—Winston Hsu

(57) ABSTRACT

A nitride light-emitting device having an adhesive reflecting layer includes a transparent adhesive layer, a nitride light-emitting stack layer and a metal reflecting layer. The transparent adhesive layer adheres the nitride light-emitting stack layer and the metal reflecting layer. Therefore, the metal reflecting layer can reflect light emitted from the light-emitting stack layer to increase the brightness of the nitride light-emitting device.

25 Claims, 5 Drawing Sheets

NITRIDE LIGHT-EMITTING DEVICE HAVING AN ADHESIVE REFLECTING LAYER

BACKGROUND OF INVENTION

1. Field of the Invention

The present invention relates to a light-emitting component, and more particularly, to a nitride light-emitting component with an adhesive reflecting layer.

2. Description of the Prior Art

The applications of light-emitting diodes are extensive and include optical display devices, traffic signals, data storing devices, communication devices, illumination devices, and medical apparatuses. As such, it is important to increase the brightness of light-emitting diodes.

Traditionally, an oxide-reflecting layer is deposited onto a transparent substrate to increase brightness of a nitride light-emitting device. The oxide-reflecting layer reflects light emitted from a light-emitting stack layer to increase overall brightness. However, the oxide-reflecting layer only reflects light of perpendicular incidence and specific wavelength. In addition, during the manufacturing process, the oxide-reflecting layer can be stripped by external force. Therefore, the reflecting efficiency of the oxide-reflecting layer is low.

Moreover, a metal layer is deposited on the transparent substrate to reflect light emitted from the light-emitting stack layer. The reflecting efficiency of the metal layer is better than the oxide-reflecting layer, but the adhesive force between the substrate and the metal is weak. In order to increase the adhesive force, a titanium or chromium layer is formed between the substrate and the metal layer. However, the titanium or chromium layer absorbs light so as to decrease the overall reflecting efficiency.

SUMMARY OF INVENTION

It is therefore a primary objective of the claimed invention to provide a transparent adhesive layer between the metal layer and the light-emitting layer to solve the above-mentioned problem. Light from the light-emitting stack layer penetrates the transparent adhesive layer and is reflected by the metal layer. In addition, reaction layers are formed on an upper surface of the transparent adhesive layer to contact the nitride light-emitting layer and on a lower surface of the transparent adhesive layer to contact the metal layer. The reaction layers react with the transparent adhesive layer to increase the adhesive force and provide resistance to being stripped. Moreover, a metal heat sink is plated on another surface of the metal layer so as to increase the brightness of the light-emitting device.

According to the claimed invention, a nitride light-emitting device having an adhesive reflecting layer comprising a first substrate, a metal reflecting layer formed on the first substrate, a first reaction layer formed on the metal reflecting layer, a transparent adhesive layer formed on the first reaction layer, a second reaction layer formed on the transparent adhesive layer, a second substrate formed on the second reaction layer, a nitride first contact layer formed on the second substrate, an upper surface of the nitride first contact layer having a first section and a second section, a nitride first cladding layer formed on the first section, a nitride light-emitting layer formed on the nitride first cladding layer, a nitride second cladding layer formed on the nitride light-emitting layer, a nitride second contact layer formed on the nitride second cladding layer, a transparent conductive layer formed on the nitride second contact layer, a first electrode formed on the transparent conductive layer, and a second electrode formed on the second section.

The first substrate comprises at least one material selected from a material group consisting of silicon, GaAs, glass, quartz, GaP, GaAsP, AlGaAs, and metal. The second substrate comprises at least one material selected from a material group consisting of $Al_2O_3$, SiC, ZnO, and GaN. The transparent adhesive layer comprises at least one material selected from a material group consisting of PI, BCB, and PFCB. The first reaction layer comprises at least one material selected from a material group consisting of SiNx, Ti, and Cr. The second reaction layer comprises at least one material selected from a material group consisting of SiNx, Ti, and Cr. The metal reflecting layer comprises at least one material selected from a material group consisting of In, Sn, Al, Au, Pt, Zn, Ag, Pb, Pd, Ge, Cu, AuBe, AuGe, Ni, PbSn, and AuZn. The nitride first cladding layer comprises at least one material selected from a material group consisting of AlN, GaN, AlGaN, InGaN, and AlInGaN. The nitride light-emitting layer comprises at least one material selected from a material group consisting of GaN, InGaN, and AlInGaN. The nitride second cladding layer comprises at least one material selected from a material group consisting of AlN, GaN, AlGaN, InGaN, and AlInGaN. The nitride first contact layer or the nitride second contact layer comprises at least one material selected from a material group consisting of GaN, InGaN, and AlGaN. The transparent conductive layer comprises at least one material selected from a material group consisting of indium tin oxide, cadmium tin oxide, antimony tin oxide, zinc oxide, and zinc tin oxide.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
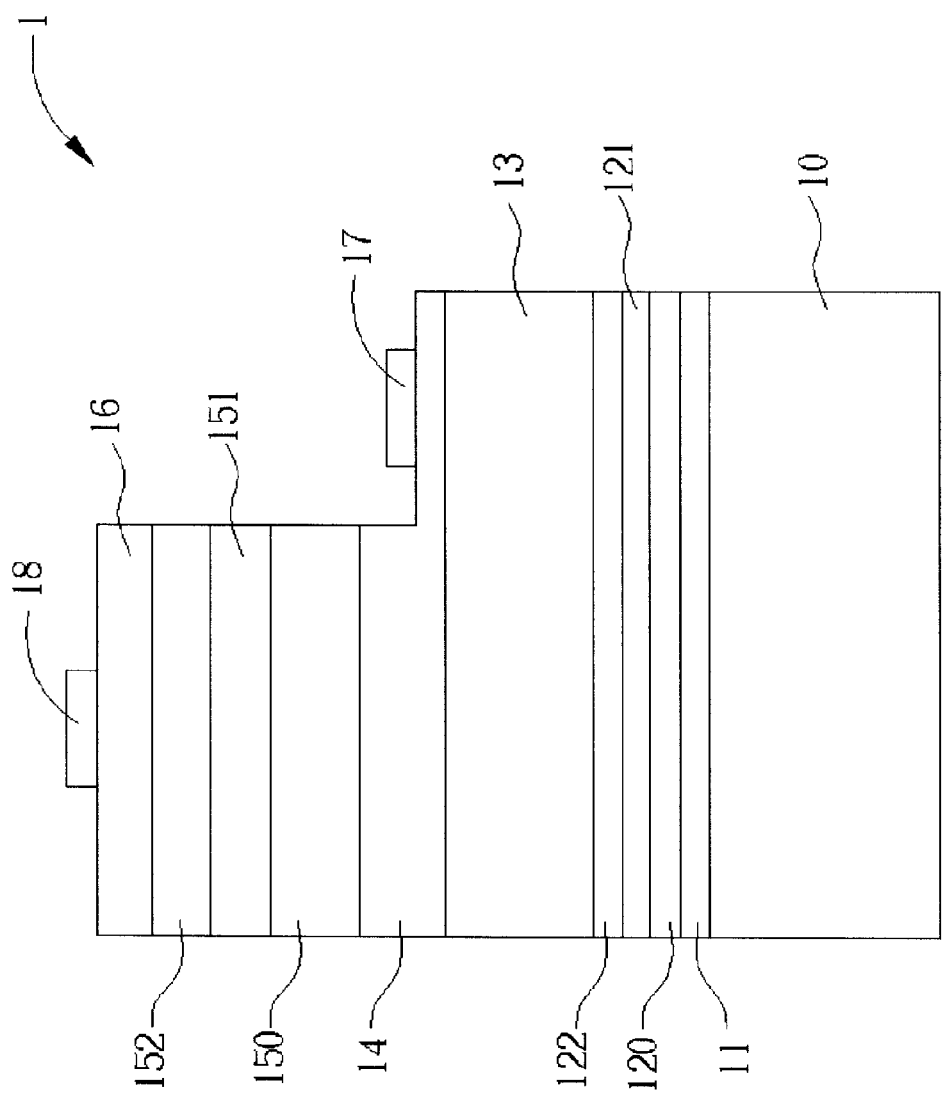
FIG. 1 is a side view of a nitride light-emitting device having an adhesive reflecting layer of a preferred embodiment according to the present invention.

Please refer to FIG. 1. FIG. 1 is a side view of a nitride light-emitting device 1 with an adhesive reflecting layer of a preferred embodiment according to the present invention. The nitride light-emitting device 1 comprises a first substrate 10, a metal reflecting layer 11 formed on the first substrate 10, a first reaction layer 120 formed on the metal reflecting layer 11, a transparent adhesive layer 121 formed on the first reaction layer 120, a second reaction layer 122 formed on the transparent adhesive layer 121, a second substrate 13 formed on the second reaction layer 122, a nitride first contact layer 14 formed on the second substrate 13 wherein an upper surface of the nitride first contact layer 14 has a first section and a second section, a nitride first cladding layer 150 formed on the first section, a nitride light-emitting layer 151 formed on the nitride first cladding layer 150, a nitride second cladding layer 152 formed on the nitride light-emitting layer 151, a nitride second contact layer 16 formed on the nitride second cladding layer 152, a first electrode 17 formed on the second section, and a second electrode 18 formed on the nitride second contact layer 16.

Figure 2:
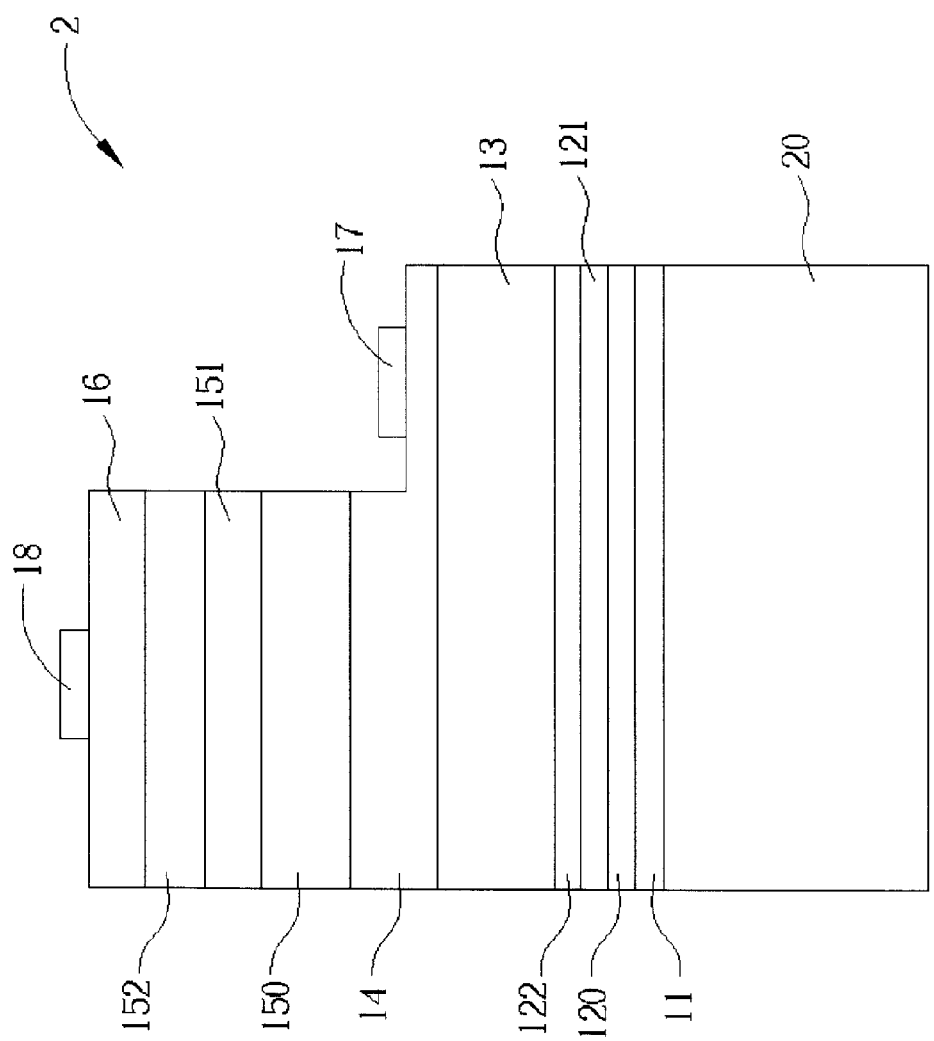
FIG. 2 is a side view of a nitride light-emitting device having an adhesive reflecting layer of another preferred embodiment according to the present invention.

Please refer to FIG. 2. FIG. 2 is a side view of a nitride light-emitting device 2 with an adhesive reflecting layer of another preferred embodiment according to the present invention. The structure of the nitride light-emitting device 2 is similar to the nitride light-emitting device 1 in the former preferred embodiment. The difference is that the first substrate 10 in the former preferred embodiment is replaced with a metal heat sink 20 so that the light-emitting device 2 can conduct heat fast.

Figure 3:
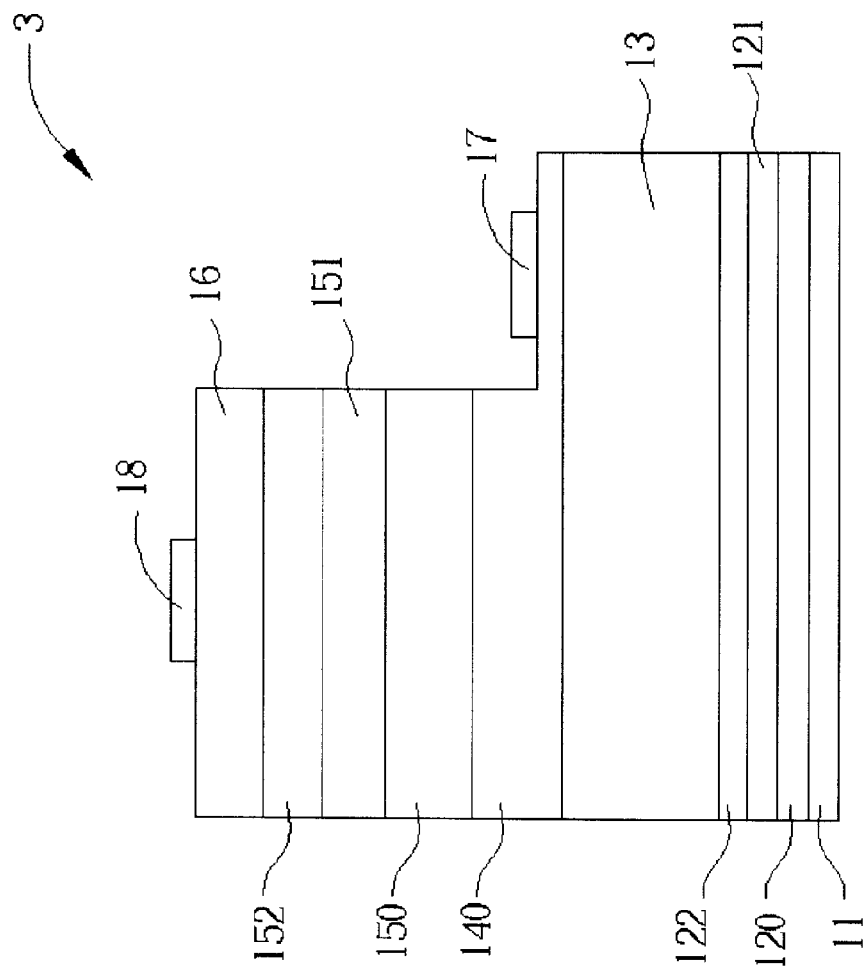
FIG. 3 is a side view of a nitride light-emitting device having an adhesive reflecting layer of another preferred embodiment according to the present invention.

Please refer to FIG. 3. FIG. 3 is a side view of a nitride light-emitting device 3 with an adhesive reflecting layer of another preferred embodiment according to the present invention. The difference between the light-emitting device 1 and the light-emitting device 3 is that the first substrate 10 of the light-emitting device 1 is removed in the light-emitting device 3.

Figure 4:
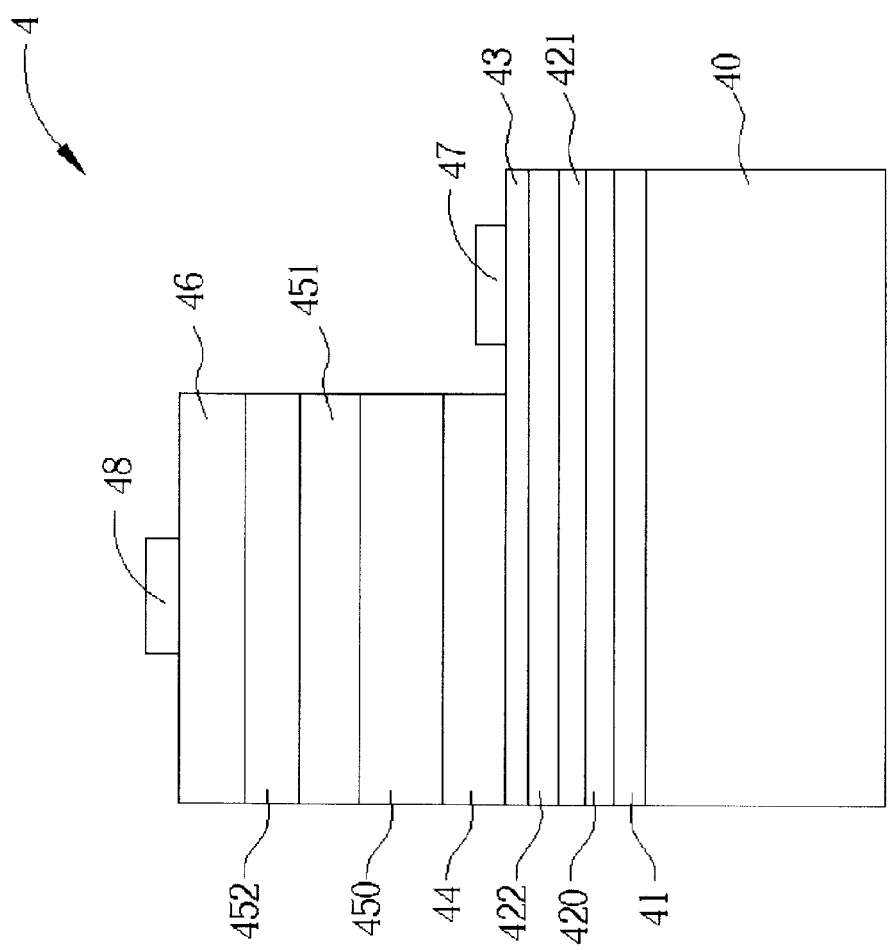
FIG. 4 is a side view of a nitride light-emitting device having an adhesive reflecting layer of another preferred embodiment according to the present invention.

Please refer to FIG. 4. FIG. 4 is a side view of a nitride light-emitting device 4 with an adhesive reflecting layer of another preferred embodiment according to the present invention. The nitride light-emitting device 4 comprises a first substrate 40, a metal reflecting layer 41 formed on the first substrate 40, a first reaction layer 420 formed on the metal reflecting layer 41, a transparent adhesive layer 421 formed on the first reaction layer 420, a second reaction layer 422 formed on the transparent adhesive layer 421, a transparent conductive layer 43 formed on the second reaction layer 422 wherein an upper surface of the transparent conductive layer 43 has a first section and a second section, a nitride first contact layer 44 formed on the first section, a nitride first cladding layer 450 formed on the nitride first contact layer 44, a nitride light-emitting layer 451 formed on the nitride first cladding layer 450, a nitride second cladding layer 452 formed on the nitride light-emitting layer 451, a nitride second contact layer 46 formed on the nitride second cladding layer 452, a first electrode 47 formed on the second section, and a second electrode 48 formed on the nitride second contact layer 46.

Figure 5:
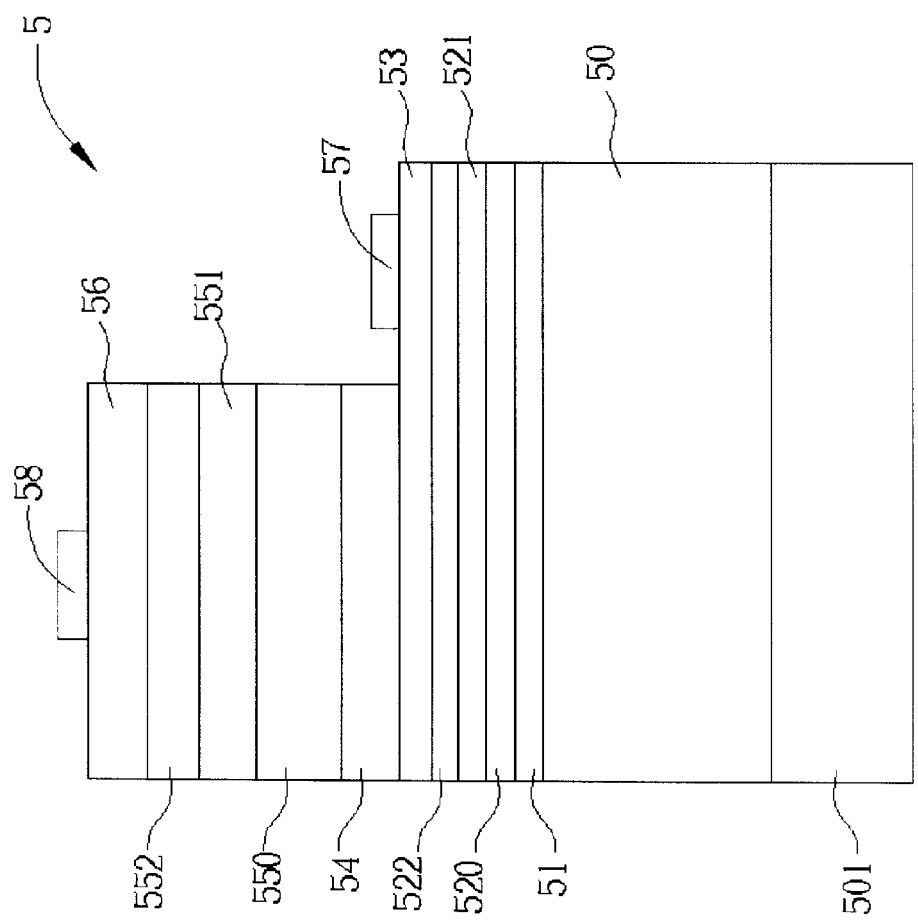
FIG. 5 is a side view of a nitride light-emitting device having an adhesive reflecting layer of another preferred embodiment according to the present invention.

Please refer to FIG. 5. FIG. 5 is a side view of a nitride light-emitting device 5 with an adhesive reflecting layer of another preferred embodiment according to the present invention. The nitride light-emitting device 5 comprises a metal heat sink 501, a first substrate 50 formed on the metal heat sink 501, a metal reflecting layer 51 formed on the first substrate 50, a first reaction layer 520 formed on the metal reflecting layer 51, a transparent adhesive layer 521 formed on the first reaction layer 520, a second reaction layer 522 formed on the transparent adhesive layer 521, a transparent conductive layer 53 formed on the second reaction layer 522 wherein an upper surface of the transparent conductive layer 53 has a first section and a second section, a nitride first contact layer 54 formed on the first section, a nitride first cladding layer 550 formed on the nitride first contact layer 54, a nitride light-emitting layer 551 formed on the nitride first cladding layer 550, a nitride second cladding layer 552 formed on the nitride light-emitting layer 551, a nitride second contact layer 56 formed on the nitride second cladding layer 552, a first electrode 57 formed on the second section, and a second electrode 58 formed on the nitride second contact layer 56.

In each said preferred embodiment, a transparent conductive layer can be formed on the nitride second contact layer and under the second electrode to be an ohmic contact layer and a current distribution layer.

The first substrate 10, 40, 50 comprises at least one material selected from a material group consisting of silicon, GaAs, glass, quartz, GaP, GaAsP, AlGaAs, and metal, or other substitute materials. The second substrate 13 comprises at least one material selected from a material group consisting of $Al_2O_3$, SiC, ZnO, and GaN. The transparent adhesive layer 121, 421, 521 comprises at least one material selected from a material group consisting of PI, BCB, and PFCB. The first reaction layer 120, 420, 520 comprises at least one material selected from a material group consisting of SiNx, Ti, and Cr. The second reaction layer 122, 422, 522 comprises at least one material selected from a material group consisting of SiNx, Ti, and Cr. The metal heat sink 20, 501 comprises at least one material selected from a material group consisting of Sn, Al, Au, Pt, Zn, Ag, Pb, Pd, Ge, Cu, AuBe, AuGe, ni, PbSn, and AuZn, or other substitute materials. The metal reflecting layer 11, 41, 51 comprises at least one material selected from a material group consisting of In, Sn, Al, Au, Pt, Zn, Ag, Pb, Pd, Ge, Cu, AuBe, AuGe, Ni, PbSn, and AuZn. The nitride first cladding layer 150, 450, 550 comprises at least one material selected from a material group consisting of AlN, GaN, AlGaN, InGaN, and AlInGaN. The nitride light-emitting layer 151, 451, 551 comprises at least one material selected from a material group consisting of GaN, InGaN, and AlInGaN. The nitride second cladding layer 152, 452, 552 comprises at least one material selected from a material group consisting of AlN-GaN, GaN, AlGaN, InGaN, and AlInGaN. In addition, the nitride first contact layer 14, 44, 54 or the nitride second contact layer 16, 46, 56 can comprise at least one material selected from a material group consisting of GaN, InGaN, and AlGaN. The transparent conductive layer 43, 53 comprises at least one material selected from a material group consisting of indium tin oxide, cadmium tin oxide, antimony tin oxide, zinc oxide, and zinc tin oxide.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A nitride light-emitting device having an adhesive reflecting layer comprising:
   a metal reflecting layer having an upper surface and a lower surface;
   a first reaction layer formed over the upper surface of the metal reflecting layer;
   a transparent adhesive layer formed over the first reaction layer;
   a second reaction layer formed over the transparent adhesive layer;
   a nitride light-emitting stack layer formed over the second reaction layer, the nitride light-emitting stack layer comprising a first surface and a second surface;
   a first electrode formed over the first surface; and
   a second electrode formed over the second surface;
   wherein each of the first and second reaction layers is formed to enhance an adhesion provided by the transparent adhesive layer.

2. The nitride light-emitting device of claim 1 wherein the nitride light-emitting stack layer comprises a nitride first contact layer, the nitride first contact layer comprising a first surface and a second surface; a nitride first cladding layer formed over the first surface; a nitride light-emitting layer formed over the nitride first cladding layer; a nitride second cladding layer formed over the nitride light-emitting layer; and a nitride second contact layer formed over the nitride second cladding layer.

3. The nitride light-emitting device of claim 2 wherein the first electrode is formed over the second surface and the second electrode is formed over the nitride second contact layer.

4. The nitride light-emitting device of claim 2 wherein the nitride first contact layer comprises at least one material selected from a material group consisting of GaN, InGaN, and AlGaN.

5. The nitride light-emitting device of claim 2 wherein the nitride first cladding layer comprises at least one material selected from a material group consisting of AlN, GaN, AlGaN, InGaN, and AlInGaN.

6. The nitride light-emitting device of claim 2 wherein the nitride light-emitting layer comprises at least one material selected from a material group consisting of GaN, InGaN, and AlInGaN.

7. The nitride light-emitting device of claim 2 wherein the nitride second cladding layer comprises at least one material selected from a material group consisting of AlNGaN, GaN, AlGaN, InGaN, and AlInGaN.

8. The nitride light-emitting device of claim 2 wherein the nitride second contact layer comprises at least one material selected from a material group consisting of GaN, InGaN, and AlGaN.

9. The nitride light-emitting device of claim 1 further comprising a first substrate formed over the lower surface of the metal reflecting layer.

10. The nitride light-emitting device of claim 9 further comprising a metal heat sink formed over a lower surface of the first substrate.

11. The nitride light-emitting device of claim 9 wherein the first substrate comprises at least one material selected from a material group consisting of silicon, GaAs, glass, quartz, GaP, GaAsP, AlGaAs, and metal.

12. The nitride light-emitting device of claim 1 further comprising a metal heat sink formed over a lower surface of the metal reflecting layer.

13. The nitride light-emitting device of claim 12 wherein the metal heat sink comprises at least one material selected from a material group consisting of Sn, Al, Au, Pt, Zn, Ag, Pb, Pd, Ge, Cu, AuBe, AuGe, Ni, PbSn, and AuZn.

14. The nitride light-emitting device of claim 1 further comprising a second substrate formed between the second reaction layer and the light-emitting stack layer.

15. The nitride light-emitting device of claim 14 wherein the second substrate comprises at least one material selected from a material group consisting of $Al_2O_3$, SiC, ZnO, and GaN.

16. The nitride light-emitting device of claim 1 further comprising a transparent conductive layer formed between the second reaction layer and the light-emitting stack layer.

17. The nitride light-emitting device of claim 16 wherein the transparent conductive layer comprises a first surface and a second surface; the first electrode is formed over the first surface; the light-emitting stack layer is formed over the second surface; and the second electrode is formed over the light-emitting stack layer.

18. The nitride light-emitting device of claim 16 wherein the transparent conductive layer comprises at least one material selected from a material group consisting of indium tin oxide, cadmium tin oxide, antimony tin oxide, zinc oxide, and zinc tin oxide.

19. The nitride light-emitting device of claim 1 wherein the metal reflecting layer comprises at least one material selected from a material group consisting of In, Sn, Al, Au, Pt, Zn, Ag, Pb, Pd, Ge, Cu, AuBe, AuGe, Ni, PbSn, and AuZn.

20. The nitride light-emitting device of claim 1 wherein the first reaction layer comprises at least one material selected from a material group consisting of $SiN_x$, Ti, and Cr.

21. The nitride light-emitting device of claim 20 wherein the transparent adhesive layer comprises PFCB.

22. The nitride light-emitting device of claim 1 wherein the transparent adhesive layer comprises at least one material selected from a material group consisting of PI, BCB, and PFCB.

23. The nitride light-emitting device of claim 22 wherein the first reaction layer comprises $SiN_x$ or Cr.

24. The nitride light-emitting device of claim 1 wherein the second reaction layer comprises at least one material selected from a material group consisting of $SiN_k$, Ti, and Cr.

25. The nitride light-emitting device of claim 24 wherein the transparent adhesive layer comprises at least one material selected from a material group consisting of PI, BCB, and PFCB.

* * * * *